United States Patent [19]

Peters, Jr.

[11] Patent Number: 4,596,068

[45] Date of Patent: Jun. 24, 1986

[54] PROCESS FOR MINIMIZING BORON DEPLETION IN N-CHANNEL FET AT THE SILICON-SILICON OXIDE INTERFACE

[75] Inventor: Solomon F. Peters, Jr., Satellite Beach, Fla.

[73] Assignee: Harris Corporation, Melbourne, Fla.

[21] Appl. No.: 566,400

[22] Filed: Dec. 28, 1983

[51] Int. Cl.$^4$ .................. H01L 21/425; H01L 21/385
[52] U.S. Cl. ..................................... 29/571; 29/576 B; 148/1.5; 148/DIG. 18
[58] Field of Search .............. 29/576 B, 571; 148/1.5, 148/DIG. 18; 357/23, 34, 23.12

[56] References Cited

U.S. PATENT DOCUMENTS

| | | | |
|---|---|---|---|
| 3,523,042 | 8/1970 | Bower et al. | 29/576 B |
| 3,607,449 | 9/1971 | Tokuyama | 148/1.5 |
| 3,799,813 | 3/1974 | Danchenko | 148/1.5 |
| 3,899,363 | 7/1975 | Dennard et al. | 148/1.5 |
| 4,000,504 | 12/1976 | Berger | 357/23.12 |
| 4,021,835 | 5/1977 | Etoh et al. | 357/23.12 |
| 4,047,974 | 9/1977 | Harari | 148/1.5 |
| 4,074,301 | 2/1978 | Paivinen et al. | 357/23 CS |
| 4,075,754 | 2/1978 | Cook, Jr. | 29/571 |
| 4,106,953 | 8/1978 | Onodera | 148/1.5 |
| 4,185,291 | 1/1980 | Hirao et al. | 357/22 |
| 4,242,691 | 12/1980 | Kotani et al. | 357/23.12 |
| 4,276,095 | 6/1981 | Beilstein, Jr. et al. | 357/23.12 |
| 4,422,885 | 12/1983 | Brower et al. | 148/1.5 |
| 4,434,543 | 3/1984 | Schwabe et al. | 29/576 B |

OTHER PUBLICATIONS

Crowder et al, "Compensating for the Depletion of Boron Produced in NPN Bipolar Transistors," IBM Technical Disclosure Bull., vol. 15, No. 3, Aug. '72.

*Primary Examiner*—Brian E. Hearn
*Assistant Examiner*—Hunter L. Auyang
*Attorney, Agent, or Firm*—Barnes & Thornburg

[57] ABSTRACT

The surface of the channel and top gates of N channel IGFETS and JFETS respectively are compensated after a high temperature processing by ion implanting boron through a protective layer. The peak impurity concentration is to occur in a sacrificial gate pad oxide layer to ensure a predictable dopant concentration in the substrate.

12 Claims, 10 Drawing Figures

PROCESS FOR MINIMIZING BORON DEPLETION IN N-CHANNEL FET AT THE SILICON-SILICON OXIDE INTERFACE

BACKGROUND AND SUMMARY OF THE INVENTION

This invention is directed to the art of manufacturing silicon semiconductor devices. Specifically, a process for producing uniform N-channel FETs is provided.

Ion-implantation of JFET structures is capable of very fine geometrical control, i.e., in the fabrication of surface patterns, and thus is of potentially significant value for LSI design and high speed, high reliability performance structures.

However, the ion-implanted N-channel JFET structures of the prior art are necessarily subjected to high temperature processing steps during which gate oxide is grown. These processing steps result in a depletion of the boron dopant at the surface P-type layer of the NJFET, resulting in significantly decreased device performance and overall utility, substantially limiting this valuable implantation process for the formation of NJFET gates. As degradation of the boron implant, particularly by diffusion out of surface silicon into gate oxide, is a necessary consequence of the high temperature processing steps universally followed in the art, strong NJFET surface gate doping through ion implantation has been difficult, if not impossible to secure through prior methods. N-channel IGFETs are also effected by the same boron surface depletion problem.

Generally, the boron depletion phenomenon overcome by the instant invention is believed to occur due to a natural unavoidable characteristic of dopants in general, and boron dopant in particular. Generally, boron or other p-type dopant is introduced into the substrate through surface implantation and deep diffusion, or similar means, which results in a curve of generally decreasing dopant levels at increasing substrate depth until a desired background dopant level is reached at the region of the lower P-type gate of an NJFET device.

This decreasing curve, as is discussed below, is desirable. However, the characteristics of this curve cannot be preserved upon high temperature processing, as practiced in the industry. It is the natural tendency of boron, and many other dopants, to migrate into surface oxide under the influence of high temperature. At the surface regions of the NJFET substrate, where the highest P-type dopant concentration is desired, this migration tends to result in loss of boron from the surface of the substrate (P-type well), decreasing the concentration in the surface region. The depletion is not only down into the substrate, but up into the protective layer. In most processing for a silicon substrate, the protective layers are silicon oxides. Since boron has a solid soluability in silicon oxide greater than in silicon, the depletion is accelerated at the silicon-silicon oxide interface. As a result, the end product has a P-type dopant concentration curve with a depletion area at the surface region of the substrate. Additionally, as the amount of depletion will be controlled and effected by various parameters including the severity of temperature and length of time of processing, the loss of boron is variable throughout a series of produced structures. This variability is especially critical when the N-channel is to be formed by ion-implantation, e.g., using phosphorous. The solid solubility of phosphorous is, contrary to boron, greater in silicon than the surface oxide, thus resulting in enhancement of phosphorous concentration in the same surface layer depleted of boron. This can severely affect FET performance, particularly prevention of surface inversion and drain-source surface (punch-through) breakdown.

Accordingly, it is one object of this invention to provide a method for construction of uniform NFET through ion-implantation.

It is another object of the invention to provide a method for producing a high quality NFET suitable for use in advanced technologies, such as monolithic design circuits.

These and other objects of the invention are attained by performing a unique boron compensation implant after all high temperature processing has been completed. For JFET and IGFET, the background gate or body regions respectively are heavily doped to the final desired level, and thereafter all bipolar or other processing, including all high-temperature processing is completed. After high-temperature processing steps have been completed, a first protective layer is formed on the silicon wafer surface, and boron dopant is implanted in the silicon surface to compensate for the boron depletion. This implant is performed to have a concentration peak in the first protective layer. Thereafter, the first layer is stripped and a second protective layer is formed and phosphorous is then implanted to from the N-channel, thereby completing the NJFET structure. For IGFETs, the compensation may be performed before or after the source-drain formation.

DETAILED DESCRIPTION OF THE DRAWINGS

Figure 1:
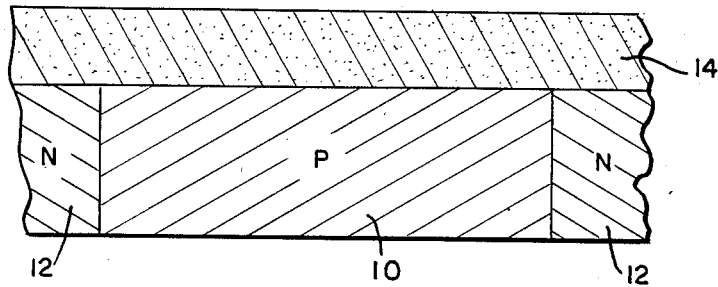
FIGS. 1 through 4 are cross-sectional views of the wafer illustrating the principles of the present invention.

The process for the present invention begins by introducing boron into a substrate to form a P-type region having the desired final dopant level for the region in which the field effect transistors (FET) is to be formed. The surface is then covered with a thick field oxide. This is illustrated in FIG. 1 wherein a P-type region 10 is formed in an N-type substrate 12 and has a thick field oxide 14 thereon. It should be noted that the illustration is schematic and that the P-type region 10 may be junction isolated from the starting N substrate 12, or may be totally dielectrically isolated wherein the boron may be front or back side introduced, although front side introduction is preferred for the desired operating characteristics, or the device may be dielectrically isolated on the lateral sides and junction isolated on the bottom. A particular method of isolation of the P-type region 10 from the remainder of the remainder of the devices in an integrated circuit is not important in the present invention. By way of example, a silicon substrate 12 having a resistivity (N-type) of 3-5 ohm centimeters has boron introduced to form a background dopant in the range of $6 \times 10^{16}$ atoms/cc. The field oxide 14 is a silicon dioxide having a thickness of 15,000-20,000 Angstroms.

Thereafter, bipolar or other processing necessary to accompany the desired specific FET structure is performed. In particular, it is critical that all high temperature processing, including, e.g., bipolar transistor diffusion, ohmic contact deposition etc. be performed before the doping steps for the remainder of the NJFET structure are performed. It is believed that the high temperature processing steps contribute significantly to the surface gate boron depletion phenomenon referred to above. By conducting the remaining ion-implantation and activation after these high-temperature processing steps have been conducted, this invention provides a FET structure of repeatably high quality.

Figure 2:
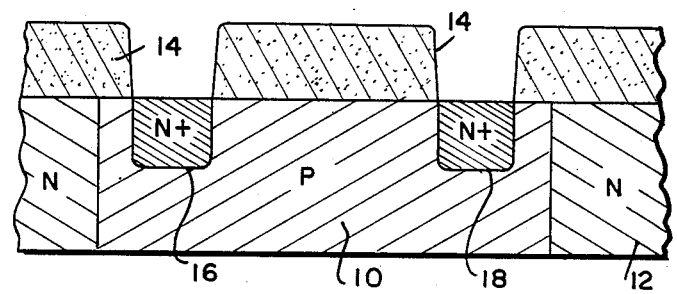

Included in these possible high temperature steps that must be performed before the compensation step, is the formation of the source and drain regions of the FET. As illustrated in FIG. 2, openings are provided in the field oxide 14 and N-type impurities, for example, phosphorus, are introduced and diffused to form the N+ source and drain regions 16 and 18 respectively.

Figure 3:
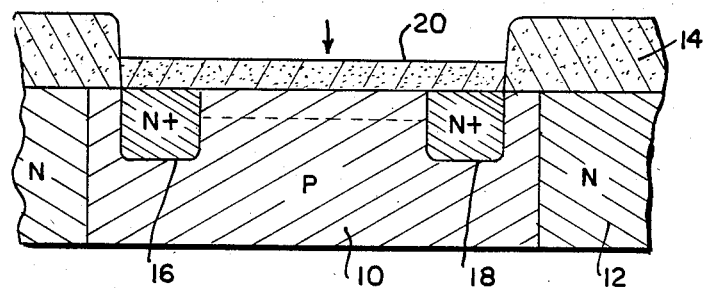

After high temperature processing has been completed, a 1,000 to 2,000 Angstrom protective layer 20, generally either oxide or nitride, is grown over the silicon wafer surface. Thereafter, boron dopant is implanted across the silicon surface, thereby compensating for the depletion of the boron in the surface P-type gate from the original doping. Although desired surface concentrations will vary according to specific utility, preferably the surface region of the substrate is doped to about $2 \times 10^{17}$ atoms/cubic centimeter. To ensure that the desired dopant profile is achieved in the surface of the P region 10, the peak concentration of the second doping should occur in the protective layer 20 leaving a relatively uniform impurity distribution in the substrate. The effected region is illustrated in FIG. 3 by the dotted line.

After implantation, the protective layer 20, together with any boron dopant therein, is stripped. The stripping can be through any conventional process, including conventional etching processes.

Figure 4:
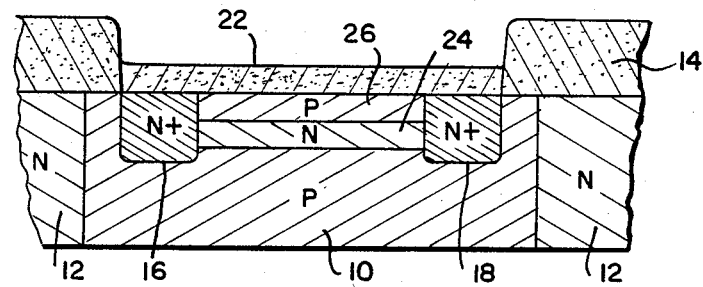

Thereafter, for an NJFET, a second protective layer 22 is grown over the silicon surface. Preferably, this second layer has a thickness of about 300 to 1,000 Angstroms. An N-type dopant such as phosphorus is then implanted to complete the N-channel of the NJFET structure by forming the thin N-channel region 24 displaced below the surface of the wafer as illustrated in FIG. 4. The phosphorus implantation is generally to a range depth of about 3,000 Angstroms. In a preferred embodiment, peak phosphorus dopant concentration is about $1 \times 10^{17}$ atoms/cubic centimeter.

Figure 5:
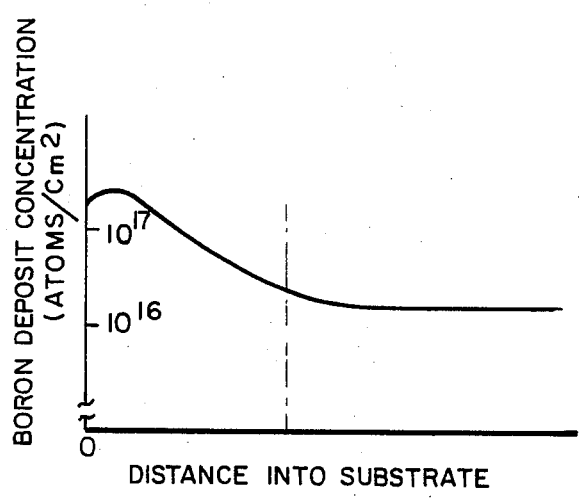
FIG. 5 is a graph of the desire P-type dopant concentration curve for an NJFET.
Figure 6:
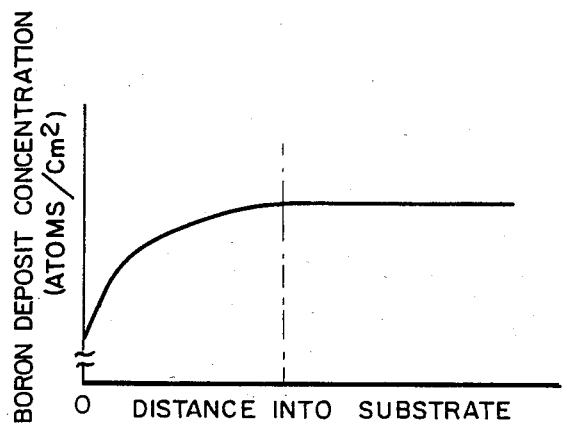
FIG. 6 is a graphic representation of the actual concentration curve of an NJFET of the prior art.
Figure 7:
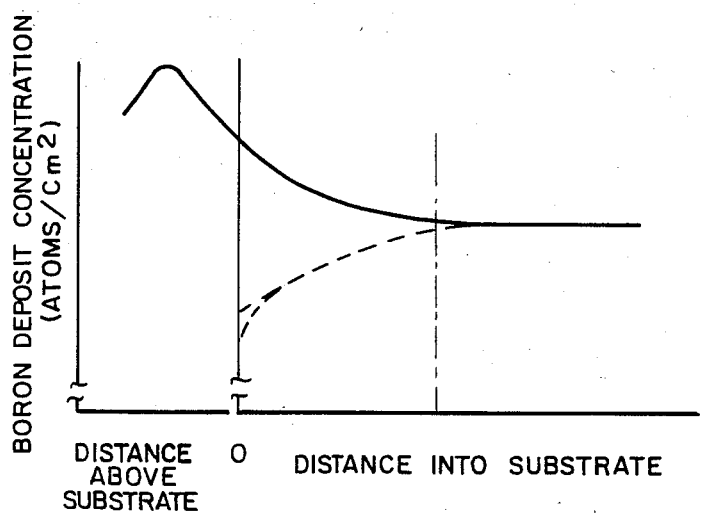
FIG. 7 is a graph of the P-type dopant concentration curve of the NJFET produced according to the process of this invention, also including concentration of the dopant in the protective layer above the substrate.

The effect of the double P-type doping of the process of this invention, and its superiority over the prior art, may be better understood by reference to FIGS. 5-7. In each of the Figures, the area lying to the right of the vertical dotted line generally represents that region of the substrate wherein the desired background level of boron concentration for the bottom P-type gate is achieved, generally a relatively constant value. As can be seen from FIG. 5, the desired concentration curve increases towards the surface, reaching maximum at or about the surface region, wherein the upper P-type gate is formed.

However, as can be seen from FIG. 6, NJFETs produced according to prior art processes wherein all P-type doping is practiced prior to high temperature processing do not reflect this "ideal" curve. In fact, boron depletion may be so severe as to actually decrease the dopant concentration in the upper regions of the substrate below the background level of the lower regions, just the opposite of what is desired. Since biased interconnects generally traverse the top gate, parasitic IGFETS are formed which will produce undesirable performance characteristics, e.g., drain-source surface punch-through breakdown.

As reflected in FIG. 7, the process of the instant invention, by virtue of the second P-type doping by implantation across the surface of the substrate avoids the problems of the prior art, and provides a generally increasing dopant concentration up to the surface of the wafer. In fact, as illustrated in FIG. 7, the peak of the concentration according to the instant process may occur in the sacrificial protective layer overlaying the surface of the substrate, in order to ensure a more predictable monotonically increasing value for dopant concentration up to the surface. As can be seen, the dopant concentration curve of the NJFET produced according to the process of this invention, up to the surface of the substrate, is quite similar to the ideal or desired curve of FIG. 5.

Computer synthesis simulations of the above process, when compared with conventional NJFET processes, indicate substantially improved breakdown characteristics, and generally improved device performance over the prior art. It is noted the PJFETs do not experience the surface depletion problem of the same degree since phosphorus gate dopants have a higher solid solubility in silicon than in silicon dioxide. Further, the computer synthesis simulated NJFET produced according to the process of this invention exhibit increased BVDSS, around 20 V, almost twice that of the NJFET of the prior art.

Figure 8:
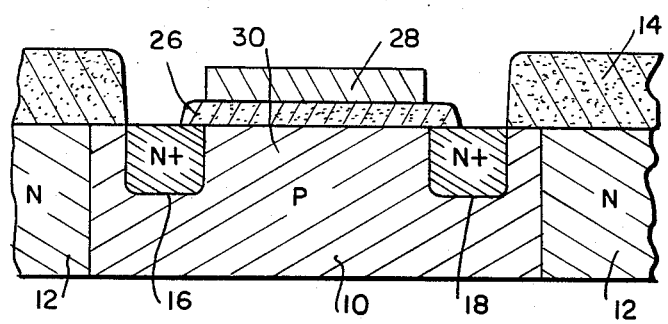
FIG. 8 is a cross-sectional view of a wafer illustrating a modification of the process for an N-channel insulated gate field effect transistor.

The concentration technique of the present invention is also applicable to N-channel insulative gate field effect transistors. The surface of the channel of the IGFETs also experience a depletion which effects the threshold voltage. For non-self-aligned gate technique processes, the process of the present invention of FIGS. 1 through 3 are the same wherein the source and drains 16 and 18 are formed before the compensation step of FIG. 3. After the boron compensation implantation, the first protective layer 20 is stripped and the gate material are applied and delineated to cover the channel region. This is illustrated specifically in FIG. 8 where the gate insulation layer 26 and gate material 28 are formed over the channel region 30 between the source and drain region 16 and 18.

Figure 9:
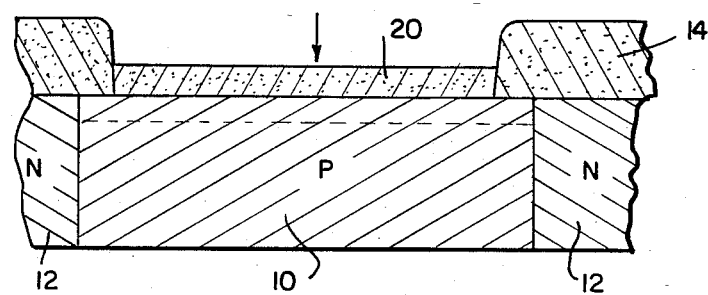
FIGS. 9 and 10 are a modification of the process of the present invention for a formation of a self-aligned insulated gate field effect transistor.
Figure 10:
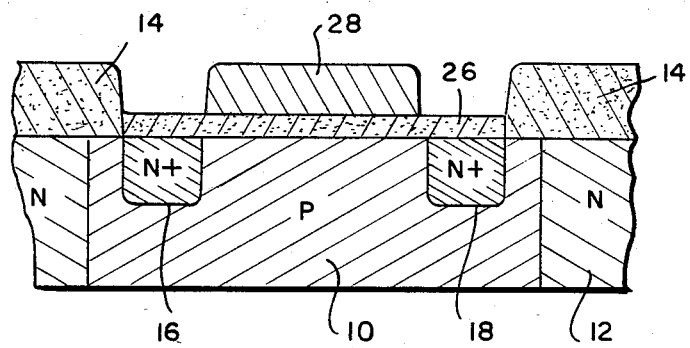

The present technique is also applicable to self-aligned gate techniques wherein the source and drain regions are formed using the gate as an alignment mask. For this process, the P region 10 is formed in the substrate 12 and is covered by field oxide 14. After the formation of all the high temperature steps, an opening is provided in the field oxide 14 to expose the P region 10. A protective layer 20 is formed thereon and a boron implantation is performed to compensate the top surface of the P region 10. This is illustrated in FIG. 9. The first protective layer 20 is then stripped and a gate insulative layer 26 and gate material 28 are applied thereon and the gate delineated. The gate and the field oxide 14 are used as alignment mask and impurities are introduced to form the source and drain region 16 and 18. To prevent further depletion during the source and drain formation step, the P-type impurities, for example, phosphorus, are introduced by ion implantation maintaining the substrate at a low temperature. An example is phosphorus being introduced at an energy rate of 30 Kev and a dose of $1\times10^{14}$ atoms/square centimeter. It should also be noted that the insulative layer 26 and the gate layer 28 should be performed at as low as temperature as possible.

This invention has been described with reference to particular and preferred embodiments. Those skilled in the art will recognize that many variations, particularly with regard to thicknesses and depth, dopant implantation methods and nature, etc., will be within the scope of the invention, and apparant without the exercise of inventive faculty.

What is claimed is:

1. A method for the manufacture of uniform NJFET structures, comprising:
    doping a portion of a substrate with boron a first time to the desired final dopant level for a background P-type gate region of the substrate in which an NJFET is to be formed;
    thereafter conducting all remaining high-temperature processing which is to be followed by the steps of;
    forming a first protective layer on the surface of said substrate;
    doping said portion of said substrate by ion-implantation with boron a second time to increase the boron concentration at the surface region of the substrate to a substantially uniform value with the peak concentration in said first protective layer;
    removing said first protective layer;
    forming a second protective layer on the surface of said substrate; and
    doping said substrate by ion-implantation with an N-type dopant to form an N-channel below the surface of said substrate.

2. The method of claim 1, wherein said first protective layer is an oxide 1,000–2,000 Angstroms in thickness.

3. The method of claim 1, wherein said second protective layer is an oxide 300–1,000 Angstroms in thickness.

4. The method of claim 1, wherein said peak N-type doping is to a depth of about 3,000 Angstroms below the surface of said substrate.

5. The method of claim 1, wherein said substrate is comprised of silicon.

6. The method of claim 1, wherein said N-type dopant is phosphorus.

7. The method of claim 1, wherein said high-temperature processing includes forming source and drain regions in said portion of said substrate.

8. The method of claim 7, wherein said high-temperature processing further includes forming base and emitter regions of bipolar transistors.

9. A method of manufacture of uniform N-channel IGFET structures comprising:
    doping a portion of a substrate with boron to the desired final dopant level for a region of the substrate in which an N-channel IGFET is to be formed;
    thereafter conducting all remaining high-temperature processing which is to be followed by the steps of;
    forming a protective layer on the surface of said substrate;
    doping said portion of said substrate with boron a second time to increase the boron concentration at the surface region of the substrate to a substantially uniform value within said region and the peak concentration being in said protective layer;
    removing said protective layer;
    forming a gate insulation layer on the surface of said region; and
    forming a gate on said gate insulation layer.

10. The method of claim 9, wherein said high temperature processing includes forming source and drain regions in said portion of said substrate.

11. The method of claim 9, including ion implanting an N-type dopant at a low temperature to form source and drains using said gate as an alignment mask.

12. The method of claim 10, wherein said high-temperature processing further includes forming base and emitter regions of bipolar transistors.

* * * * *